United States Patent [19]

Unno

[11] Patent Number: 5,459,000

[45] Date of Patent: Oct. 17, 1995

[54] IMAGE PROJECTION METHOD AND DEVICE MANUFACTURING METHOD USING THE IMAGE PROJECTION METHOD

[75] Inventor: Yasuyuki Unno, Hadano, Japan

[73] Assignee: Canon Kabushiki Kaisha, Tokyo, Japan

[21] Appl. No.: 130,903

[22] Filed: Oct. 4, 1993

[30] Foreign Application Priority Data

| Oct. 14, 1992 | [JP] | Japan | 4-276062 |
| Oct. 14, 1992 | [JP] | Japan | 4-276065 |
| Apr. 5, 1993 | [JP] | Japan | 5-078162 |

[51] Int. Cl.⁶ .................................................... G03F 9/00
[52] U.S. Cl. .............................. 430/5; 430/296; 430/311; 359/485; 359/489
[58] Field of Search ............................... 430/5, 311, 296; 359/485, 489

[56] References Cited

U.S. PATENT DOCUMENTS

| 3,917,399 | 11/1975 | Buzawa et al. | 355/43 |
| 4,947,413 | 8/1990 | Jewell et al. | 378/34 |
| 5,048,926 | 9/1991 | Tanimoto | 359/487 |
| 5,153,773 | 10/1992 | Muraki et al. | 359/619 |
| 5,245,470 | 9/1993 | Keum | 359/485 |
| 5,316,879 | 5/1994 | Berger et al. | 430/5 |

OTHER PUBLICATIONS

Matsumoto, et al., "Issues and Method of Designing Lenses for Optical Lithography," Optical Engineering, vol. 31, No. 12, Dec. 1992, pp. 2657 through 2664.

*Primary Examiner*—S. Rosasco
*Attorney, Agent, or Firm*—Fitzpatrick, Cella, Harper & Scinto

[57] ABSTRACT

An image of a fine pattern having light-projecting portions and non-light-projecting portions is formed by illuminating the fine pattern. Upon illumination of the fine pattern, light beams are projected from respective light-projecting portions of the pattern onto an image-forming surface to form an image. Coherency of light beams from respective adjacent light-projecting portions is reduced to provide an image of the fine pattern having high contrast.

16 Claims, 17 Drawing Sheets

21 22 23 24 25

(μm)

(μm)

(μm)

FIG.17
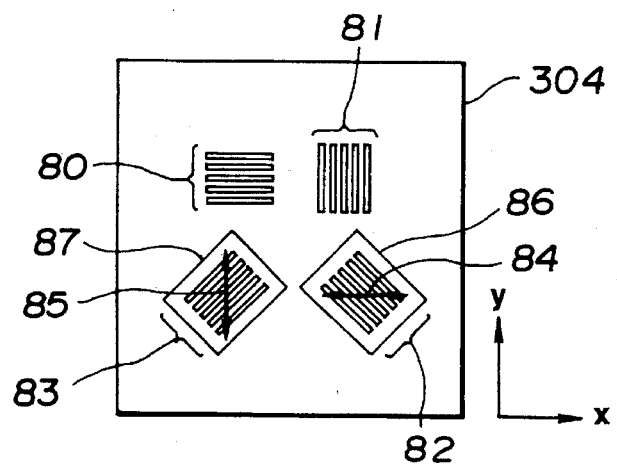
FIG.18(A)   FIG.18(B)
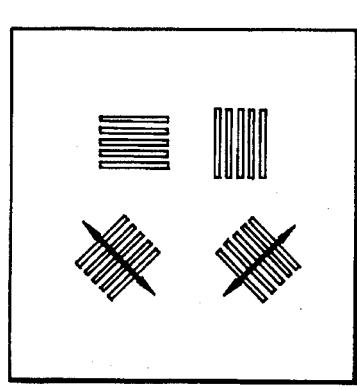 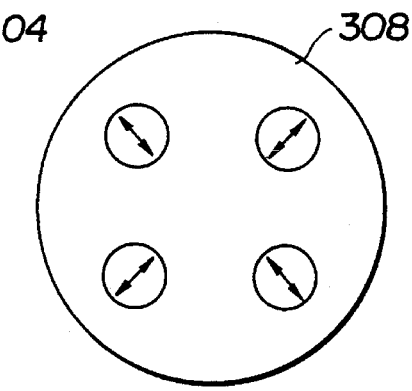
FIG.19(A)   FIG.19(B)
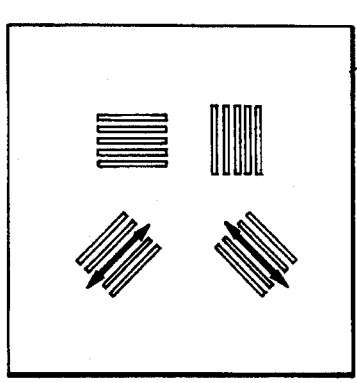 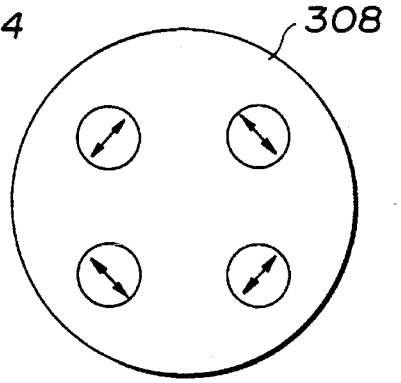

IMAGE PROJECTION METHOD AND DEVICE MANUFACTURING METHOD USING THE IMAGE PROJECTION METHOD

BACKGROUND OF THE INVENTION

1. Field of the Invention

This invention relates to an image projection method, and a device manufacturing method for manufacturing various kinds of devices, such as IC's (integrated circuits), LSI's (large-scale integrated circuits), CCD's (charge-coupled devices), liquid-crystal panels, magnetic heads and the like, using the image projection method.

2. Description of the Related Art

High integration of semiconductor devices, such as IC's, LSI's or the like, has increased rapidly, and the corresponding fine processing technique for processing semiconductor wafers has developed remarkably. In the projection exposure technique, which is an essential component of the fine processing technique, a current goal is to improve resolution so that an image having dimensions equal to or less than 0.5 µm can be formed.

In order to improve resolution, consideration has been given to a method of increasing the numerical aperture (NA) of a projection optical system and a method of shortening the wavelength of exposure light. However, since there are limitations to the amount of improvement possible with both of the above-described methods, a new method of improving resolution is needed.

SUMMARY OF THE INVENTION

It is an object of the present invention to provide an image forming method having high resolution, a method of manufacturing devices using the image forming method, and a photomask which is used in the device manufacturing method.

According to a first aspect, the present invention provides a method of forming an image of a fine pattern on an image-forming surface. The method includes the step of providing a reticle having a fine pattern of light-projecting portions separated by non-light-projecting portions formed thereon. The method also includes the steps of illuminating the reticle to project light beams from the light-projecting portions of the fine pattern onto the image-forming surface, to form an image thereon, and reducing coherence between light beams respectively projected from adjacent light-projecting portions.

According to another aspect, the present invention provides a method of manufacturing a device. The method includes steps of providing a reticle having a fine pattern of light-projecting portions separated by non-light-projecting portions formed thereon, providing a wafer and projecting an image of the fine pattern onto the wafer. The projecting step includes illuminating the reticle to project light beams from the light-projecting portions of the fine pattern onto the wafer and reducing coherence between light beams respectively projected from adjacent light-projecting portions. The wafer is then post-processed to form the device.

Yet another aspect of the present invention provides a photomask that projects radiation beams from light-projecting portions when the photomask is irradiated. The photomask includes a reticle having a fine pattern of light-projecting portions separated by non-light-projecting portions formed thereon and coherence reducing means for reducing coherence between radiation beams that are projected from respective adjacent light-projecting portions. In one embodiment of the present invention, the light-projecting portions may be light-transmitting portions, and the non-light-projecting portions may be light-blocking portions (either light-reflecting or light-absorbing), for example, in a transmission-type mask. In another embodiment, the light-projecting portions may be light-reflecting portions, and the non-light-projecting portions may be light-blocking portions (either light-transmitting or light-absorbing), for example, in a reflection-type mask.

Still another aspect of the present invention provides an image forming method for illuminating first and second grating patterns to form images of the grating patterns on an image-forming surface. The method includes providing a first grating pattern having grating lines and a second grating pattern having grating lines substantially orthogonal to the grating lines of the first grating pattern. The method further includes illuminating the first and second grating patterns with an obliquely incident first light beam to form a plane of incidence parallel to the grating lines of the first grating pattern and illuminating the first and second grating patterns with an obliquely incident second light beam to form a plane of incidence parallel to the grating lines of the second grating pattern. Also, the method includes providing the first grating pattern with light selection means for blocking the first light beam and passing the second beam, to form an image of the first grating pattern on the image-forming surface using the second light beam, and providing the second grating pattern with light selection means for blocking the second light beam and passing the first light beam, to form an image of the second grating pattern on the image-forming surface using the first light beam.

According to yet another aspect, the present invention provides an image forming method for illuminating first and second grating patterns to form images of the grating patterns. The method includes providing a first grating pattern having grating lines and a second grating pattern having grating lines substantially orthogonal to the grating lines of the first grating pattern. The method also includes linearly polarizing a first light beam in a first plane and illuminating the first and second grating patterns with the first light beam so that it is obliquely incident to form a plane of incidence parallel to the grating lines of the first grating pattern. The method further includes linearly polarizing a second light beam in a second plane orthogonal to the first plane and illuminating the first and second grating patterns with the second light beam so that it is obliquely incident to form a plane of incidence parallel to the grating lines of the second grating pattern. In addition, the method includes providing the first grating pattern with polarizing means for blocking the first light beam, to form an image of the first grating pattern using the second light beam, and providing the second grating pattern with polarizing means for blocking the second light beam, to form an image of the second grating pattern using the first light beam.

According to still another aspect, the present invention provides a device manufacturing method. The method includes providing a reticle having formed thereon a device circuit pattern including a first grating pattern having grating lines and a second grating pattern having grating lines substantially orthogonal to the grating lines of the first grating pattern and providing a wafer to receive an image of the circuit. The method also includes linearly polarizing a first light beam in a first plane and illuminating the reticle with the first light beam so that it is obliquely incident to form a plane of incidence parallel to the grating lines of the first grating pattern. The method further includes linearly polarizing a second light beam in a second plane orthogonal to the first plane and illuminating the reticle with the second light beam so that it is obliquely incident to form a plane of incidence parallel to the grating lines of the second grating pattern. In addition, the method includes providing the first grating pattern with polarizing means for blocking the first light beam, to project an image of the first grating pattern of the circuit onto the wafer using the second light beam, and providing the second grating pattern with polarizing means, to project an image of the second grating pattern of the circuit onto the wafer using the first light beam. The wafer is then post-processed to form the device.

A further aspect of the present invention provides an image forming method for forming images of first, second and third grating patterns by illumination. The method includes providing a first grating pattern having grating lines and a second grating pattern having grating lines substantially orthogonal to the grating lines of the first grating pattern and providing a third grating pattern having grating lines in an oblique direction with respect to grating lines of the first and second grating patterns. The method also includes linearly polarizing a first light beam in a first plane and illuminating all of the grating patterns with the first light beam so that it is obliquely incident to form a plane of incidence parallel to the grating lines of the first grating pattern. The method further includes linearly polarizing a second light beam in a second plane orthogonal to the first plane and illuminating all of the grating patterns with the second light beam so that it is obliquely incident to form a plane of incidence parallel to the grating lines of the second grating pattern. In addition, the method includes providing the first grating pattern with polarizing means for blocking the first light beam, to form an image of the first grating pattern using the second light beam, and providing the second grating pattern with polarizing means for blocking the second light beam, to form an image of the second grating pattern using the first light beam. Also, an image of the third grating pattern is formed using light from the first and second light beams.

Still a further aspect of the present invention provides a device manufacturing method. The method includes providing a reticle having formed thereon a device circuit pattern including a first grating pattern having grating lines, a second grating pattern having grating lines substantially orthogonal to the grating lines of the first grating pattern and a third grating pattern having grating lines in an oblique direction with respect to the grating lines of the first and second grating patterns, and providing a wafer to receive an image of the circuit pattern. The method also includes linearly polarizing a first light beam in a first plane and illuminating the reticle with the first light beam so that it is obliquely incident to form a plane of incidence parallel to the grating lines of the first grating pattern. The method further includes linearly polarizing a second light beam in a second plane orthogonal to the first plane and illuminating the reticle with the second light beam so that it is obliquely incident to form a plane of incidence parallel to the grating lines of the second grating pattern. In addition, the method includes providing the first grating pattern with polarizing means for blocking the first light beam and providing the second grating pattern with polarizing means for blocking the second light beam. The wafer is then post-processed to form the device.

Yet a further aspect of the present invention provides a device manufacturing method including steps of providing a reticle having formed thereon a device circuit pattern including a first grating pattern having grating lines and a second grating pattern having grating lines substantially orthogonal to the grating lines of the first grating pattern and providing a wafer to receive a projected image of the circuit pattern. The method further includes illuminating the reticle with a first light beam that is obliquely incident to form a plane of incidence parallel to the grating lines of the first grating pattern and illuminating the reticle with a second light beam that is obliquely incident to form a plane of incidence parallel to the grating lines of the second grating pattern. In addition, the method includes providing the first grating pattern with light selection means for blocking the first light beam and passing the second light beam and providing the second grating pattern with light selection means for blocking the second light beam and passing the first light beam. The wafer is then post-processed to form the device.

The foregoing and other objects, advantages and features of the present invention will become more apparent from the following description of the preferred embodiments taken in conjuction with the accompanying drawings.

BRIEF DESCRIPTION OF THE DRAWINGS

FIG. 1(A) illustrates an arrangement of fine slits, FIG. 1(B) illustrates a light intensity distribution at an image-forming surface when a fine-slit string having a line width of 0.5 µm and a period of 1.0 µm is imaged, and FIG. 1(C) illustrates a light intensity distribution at the image-forming surface when a fine-slit string having a line width of 0.3 µm and a period of 0.6 µm is imaged;

FIGS. 2(B) and 2(C) illustrate a state in which a fine-slit string is divided into a pair of fine-slit strings having a period twice the original period, FIG. 2(C) illustrates a light intensity distribution at the image-forming surface when the fine-slit string shown in FIG. 2(A) is imaged, FIG. 2(D) illustrates a light intensity distribution at the image-forming surface when the fine-slit string shown in FIG. 2(B) is imaged, FIG. 2(E) illustrates a distribution obtained by superposing the light intensity distribution shown in FIG. 2(C) and the light intensity distribution shown in FIG. 2(D), and FIG. 2(F) illustrates a fine-slit string having polarizing films for providing the light intensity distribution shown in FIG. 2(E) at the image-forming surface;

FIG. 4(A) is a plan view of the reticle, and FIGS. 4(B) and 4(C) illustrate examples of the orientations of polarization of polarizing films provided for respective slits of the slit string shown in FIG. 4(A);

FIG. 15(A) is a diagram illustrating a mask and obliquely incident light beams, FIG. 15(B) is a plan view of the mask, FIG. 15(C) is a plan view of an aperture stop, FIG. 15(D) is a diagram illustrating a light intensity distribution at the image-forming surface when a fine-slit string comprising vertical lines having a line width of 0.3 μm and a period of 0.6 um is imaged by the oblique illumination shown in FIG. 15(A), FIGS. 15(E) and IS(F) are plan views illustrating other configurations of the mask, FIG. 15(G) is a diagram illustrating a light intensity distribution at the image-forming surface when a fine-slit string comprising oblique lines having a line width of 0.3 μm and a period of 0.6 μm is imaged by oblique illumination along a plane of incidence orthogonal to the oblique lines, FIG. 15(H) is a diagram illustrating a light intensity distribution at the image-forming surface when a fine-slit string comprising oblique lines having a line width of 0.3 μm and a period of 0.6 μm is imaged by oblique illumination along a plane of incidence parallel to the oblique lines, and FIG. 15(I) is a diagram illustrating a light intensity distribution at the image-forming surface when a fine-slit string comprising oblique lines having a line width of 0.3 μm and a period of 0.6 μm is imaged by oblique illumination along a plane of incidence parallel to the oblique lines and a plane of incidence orthogonal to the oblique lines;

FIG. 16(A) is a plan view of a reticle, and FIG. 16(B) is a plan view of an aperture stop;

FIG. 17 is a plan view illustrating another configuration of the reticle;

FIGS. 18(A) and 18(B) are schematic diagrams illustrating another example of the orientation of polarization of polarizing films provided on a reticle and the orientation of polarization of polarizing films provided on apertures of an aperture stop;

FIGS. 19(A) and 19(B) are schematic diagrams illustrating still another example of the orientation of polarization of polarizing films provided on a reticle and the orientation of polarization of polarizing films provided on apertures of an aperture stop;

DESCRIPTION OF THE PREFERRED EMBODIMENTS

Figure 1A:
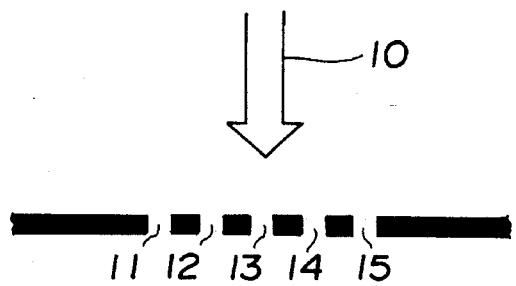
FIGS. 1(A) through 1(C) are diagrams illustrating image formation of a fine pattern.
Figure 1B:
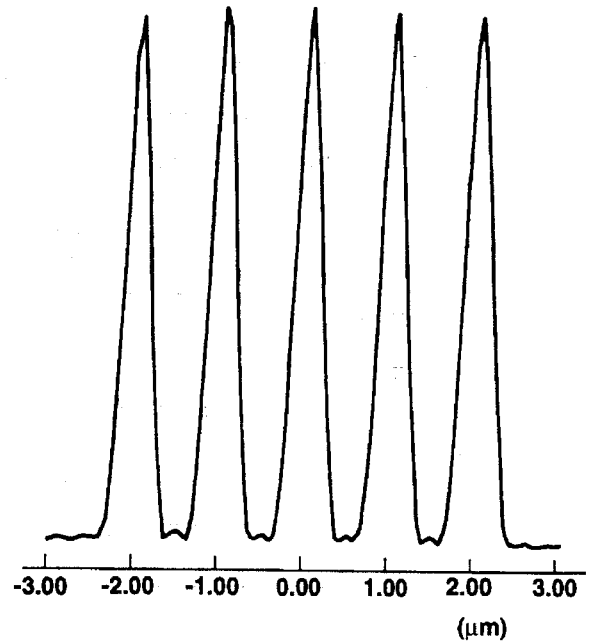
Figure 1C:
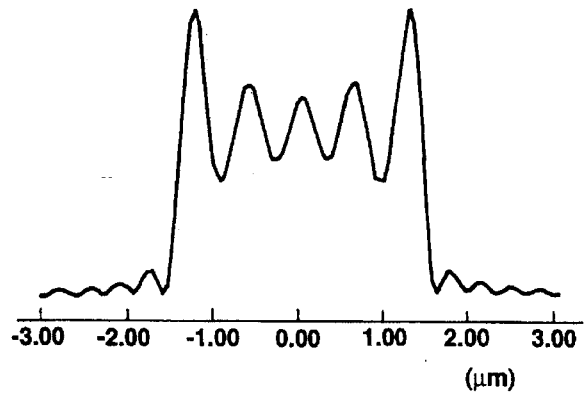

In order to facilitate the understanding of the contents of the present invention, a description will be provided of image formation of a fine pattern with reference to FIGS. 1(A) through 1(C). As shown in FIG. 1(A), a string of five fine slits 11–15 is illuminated by illuminating light 10, and diffracted light generated by the string of fine slits 11–15 is incident upon the pupil of a projection lens system (not shown), which forms an image of the string of fine slits 11–15 on the image plane thereof. The intensity distribution of an image of a fine-slit string at the image plane of the projection lens system will be simulated assuming that (i) the projection lens system is an aberration-free lens having a numerical aperture of 0.55, (ii) illumination by illuminating light 10 comprises coherent illumination, and (iii) illuminating light 10 comprises i-line light (i.e., light having a wavelength of 365 nm). While the intensity distribution of the image of the fine-slit string at the image surface of the projection lens system when the string of fine slits 11–15 has a line width of 0.5 μm and a period of 1.0 μm shows a high contrast as shown in FIG. 1(B), the intensity distribution of the image of the fine-slit string at the image plane of the projection lens system when the string of fine slits 11–15 has a line width of 0.3 μm and a period of 0.6 μm shows a low contrast as shown in FIG. 1(C). One of the reasons that the contrast of the intensity distribution of the image of the fine-slit string at the image surface decreases as the line width and the period of arrangement of fine slits 11–15 decreases is that the angle of diffraction of high-order diffracted light from the string of fine slits 11–15 increases, and therefore the high-order diffracted light is not incident upon the pupil of the projection lens system. In the present invention, by causing diffracted light beams from adjacent fine slits in the string of fine slits 11–15 to be incoherent, high-order diffracted light is incident upon the pupil of the projection lens system.

Figure 2A:
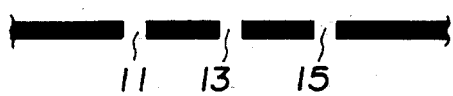
FIGS. 2(A) through 2(F) are diagrams illustrating an embodiment of the present invention.
Figure 2B:
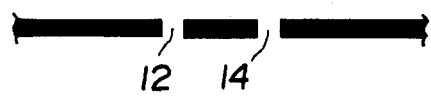

Next, a description will be provided of an image projection method according to an embodiment of the present invention with reference to FIGS. 2(A)–2(F). Each of FIGS. 2(A) and 2(B) illustrates an object having fine slits (for example, an original for manufacturing semiconductor devices). The fine-slit string shown in FIG. 2(A) is obtained by leaving odd-numbered slits 11, 13 and 15, and removing even-numbered slits 12 and 14 in the string of fine slits 11–15 shown in FIG. 1(A). The fine-slit string shown in FIG. 2(B) is obtained by leaving even-numbered slits 12 and 14, and removing odd-numbered slits 11, 13 and 15 in the string of fine slits 11–15 shown in FIG. 1(A). The period of each of the fine-slit strings shown in FIGS. 2(A) and 2(B) is twice the period of the fine-slit string shown in FIG. 1(A). Accordingly, the fine-slit string shown in FIG. 1(A) is obtained by combining the fine-slit strings shown in FIGS. 2(A) and 2(B).

Figure 2C:
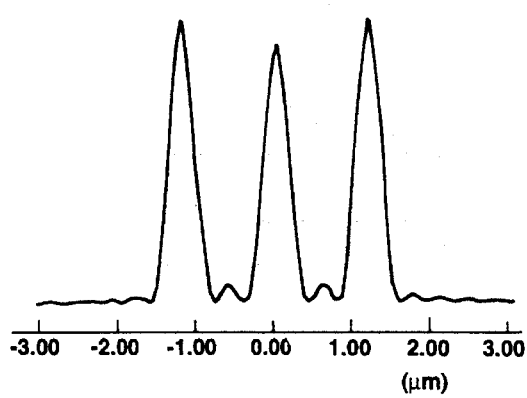
Figure 2D:
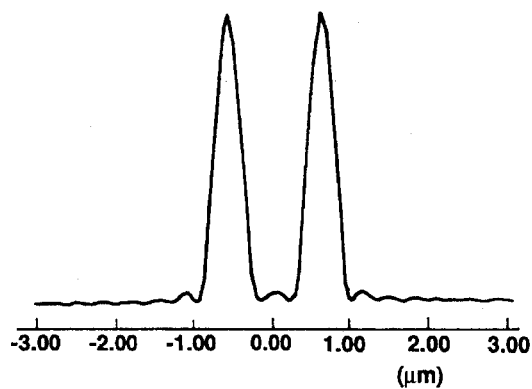

A case of imaging each of the fine-slit strings shown in FIGS. 2(A) and 2(B) by the projection lens system will now be considered. In the same manner as in the above-described simulation, the intensity distribution of each of the fine-slit strings at the image plane of the projection lens system will be simulated assuming that (i) the projection lens system includes an aberration free lens having a numerical aperture of 0.55, (ii) illumination comprises coherent illumination, and (iii) illuminating light comprises the i-line. The intensity distributions of the images of the fine-slit strings shown in FIGS. 2(A) and 2(B) at the image plane of the projection lens system when the line width of fine slits 11–15 equals 0.3

μm, and the period of each of the strings of fine slits 11, 13 and 15 and the string of fine slits 12 and 14 equals 1.2 μm are as shown in FIGS. 2(C) and 2(D), respectively.

Figure 2E:
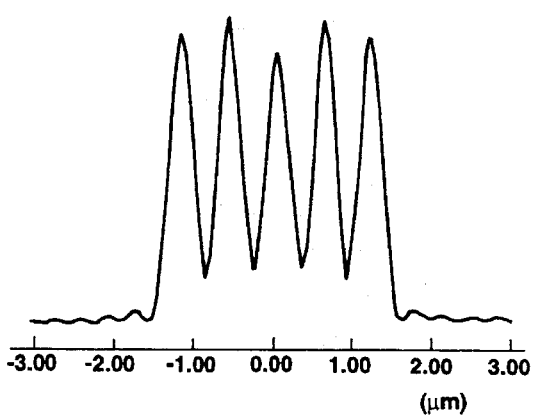

Accordingly, the intensity distribution shown in FIG. 2(E) is obtained by superposing the images of the fine-slit strings shown in FIGS. 2(A) and 2(B) without causing interference. Hence, it becomes possible to form an image corresponding to the string of fine slits having a line width of 0.3 μm and a period of 0.6 μm.

Figure 2F:
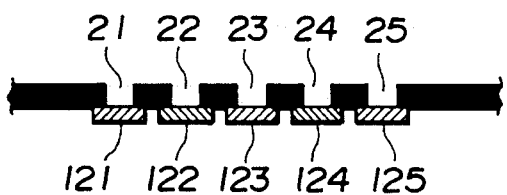

In the present embodiment, by improving an object having a fine-slit string as shown in FIG. 1(A), an image having an intensity distribution as shown in FIG. 2(E) can be formed. FIG. 2(F) illustrates an object having a string of fine slits 21–25 and a string of polarizing films 121–125 formed on the corresponding slits. In FIG. 2(F), each of fine slits 21–25 represented by blank portions constitutes a light-transmitting portion of the object, such as an original or the like, and each portion represented by a dark portion indicates a light-blocking portion of the object. Fine slits 21, 23 and 25 present at odd-numbered portions from the right end are defined to belong to group A, and fine slits 22 and 24 present at even-numbered portions from the right end are defined to belong to group B. Group A and group B correspond to the fine-slit strings shown in FIGS. 2(A) and 2(B), respectively.

In FIG. 2(F), polarizing films 121, 123 and 125 are provided for fine slits 21, 23 and 25, respectively, so that diffracted light beams traveling from fine slits 21, 23 and 25 of group A become linearly-polarized light beams having the same orientation of polarization (for example, light beams polarized in a direction orthogonal to the plane of FIG. 2(F)). That is, polarizing films 121, 123 and 125 having the same orientation of polarization are provided for fine slits 21, 23 and 25, respectively. On the other hand, polarizing films 122 and 124 are provided for fine slits 22 and 24, respectively, so that diffracted light beams traveling from fine slits 22 and 24 of group B become linearly-polarized light beams having the same orientation of polarization and polarized in a direction orthogonal to the orientation of polarization of diffracted light beams from the portions of the fine slits and the corresponding polarizing films of group A (for example, a direction parallel to the plane of FIG. 2(F)). That is, polarizing films 122 and 124 having the same orientation of polarization are provided for fine slits 22 and 24, respectively. The diffracted light beams traveling from fine slits 21, 23 and 25 of group A and the diffracted light beams traveling from fine slits 22 and 24 of group B are incoherent, since the orientations of polarization of the diffracted light beams of the respective groups are orthogonal to each other. Hence, diffracted light beams from adjacent fine slits belonging to different groups do not interfere with each other, although they are partially superposed on the image surface. Since the period of arrangement of fine slits in each of groups A and B is twice the period of arrangement of original fine slits 21–25, high-order diffracted light from each group is incident upon the pupil of the projection lens system. Accordingly, as in the case described with reference to FIGS. 2(A)–2(E), the image of the string of fine slits 21–25 can be formed on the image plane with a high contrast.

Figure 3:
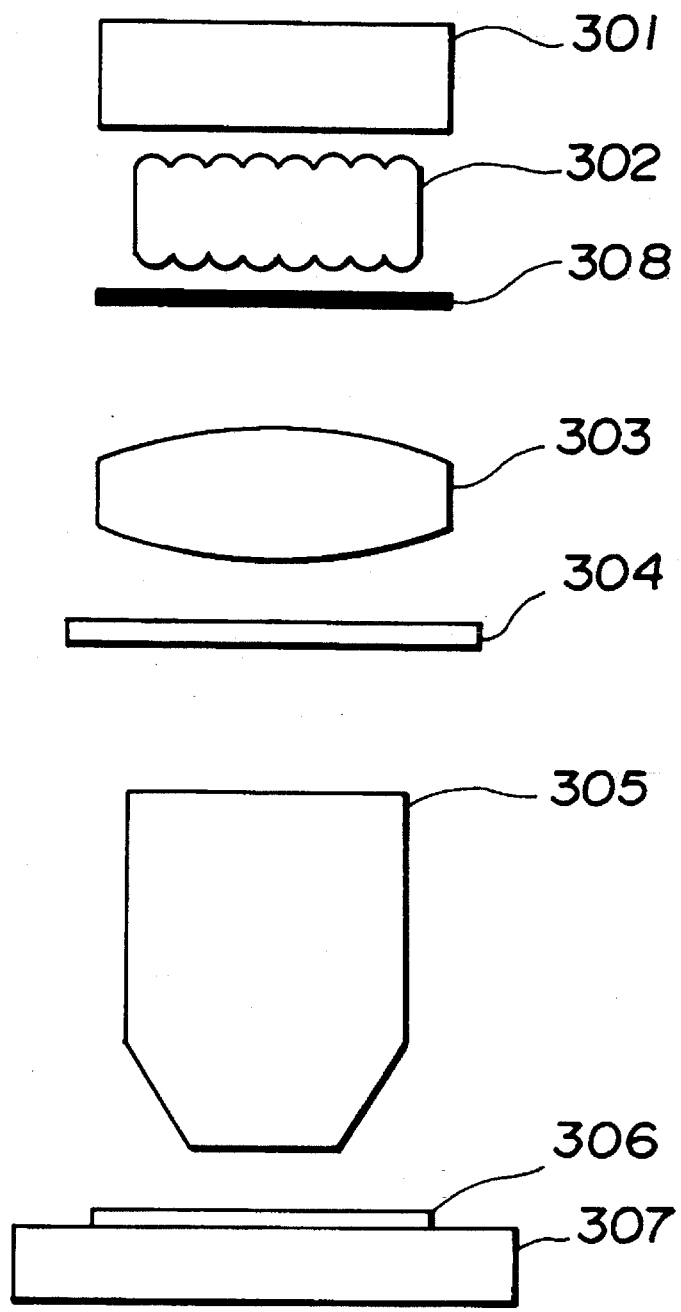
FIG. 3 is a diagram illustrating a reduction projection exposure apparatus for manufacturing semiconductor devices.

FIG. 3 is a schematic diagram illustrating a reduction projection exposure apparatus for manufacturing semiconductor devices. In FIG. 3, light-source unit 301 includes an extra-high pressure mercury lamp. Optical integrator 302 includes a fly-eye lens. Reference numeral 303 represents an illuminating lens system. Reference numeral 304 represents a reticle. A circuit pattern including a grating-like pattern (line and space) is formed on reticle 304. Reference numeral 305 represents a reduction projection lens system having a magnification of ⅕ or 1/10. Reference numeral 308 represents a semiconductor wafer. Stage 307 is used for mounting and moving wafer 308. Reference numeral 308 represents an aperture stop.

Exposure light emitted from light-source unit 301 illuminates reticle 304 via integrator 302, aperture stop 308 and illuminating lens system 303. Diffracted light from the circuit pattern on reticle 304 is incident upon the pupil of projection lens system 305, and an image of the circuit pattern is projected onto wafer 308 mounted on stage 307 by the diffracted light passing through projection lens system 305. The position of aperture stop 308 disposed close to the outgoing-light surface of integrator 302 and the pupil of projection lens system 305 are optically conjugate. Only a portion of the circuit pattern of reticle 304 that is suitable for image formation is selected from the light from integrator 302 by the aperture of aperture stop 308, and is transmitted to illuminating lens system 303 to be used for projection exposure.

A resist (a photosensitive material) is coated on wafer 306. The resist on wafer 306 is sensitized by the circuit-pattern image. Thus, the circuit pattern is transferred onto wafer 306.

Reticle 304 and wafer 306 are aligned to a predetermined relationship by moving stage 307 on which wafer 306 is mounted. After exposure on the first region (shot region) of wafer 306 has been completed, wafer 306 is moved in the horizontal direction by a predetermined amount by moving stage 307, and exposure on the second region (shot region) of wafer 306 is performed (exposure by a step-and-repeat method).

Figure 4A:
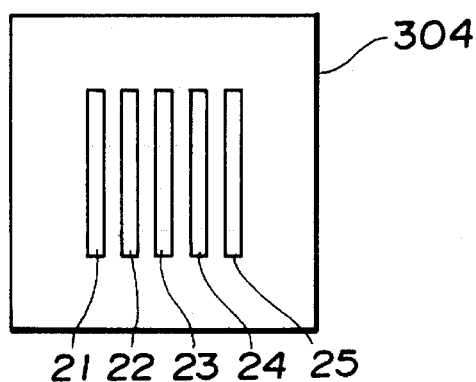
FIGS. 4(A) through 4(C) are diagrams illustrating a reticle used in the exposure apparatus shown in FIG. 3.
Figure 4B:
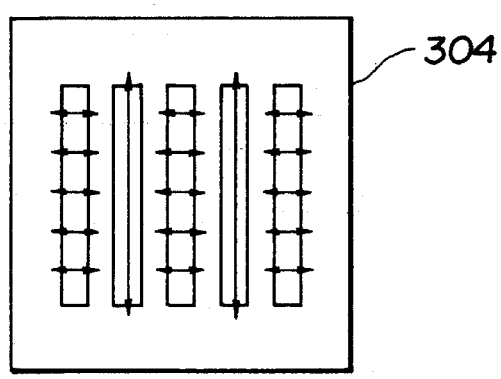
Figure 4C:
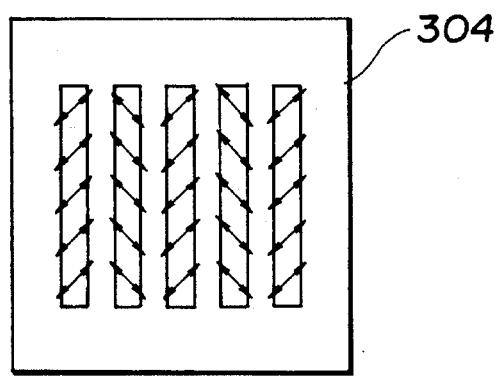

The portion of the grating-like pattern of reticle 304 has the structure shown in FIG. 2(F). That is, reticle 304 includes the string of fine slits 21–25 having a line width of a few μm and polarizing films provided for the respective fine slits. FIG. 4(A) is a plan view of reticle 304, as seen from the side of light-source unit 301. Examples of the orientation of polarization of the respective polarizing films (not shown) are indicated by arrows in FIGS. 4(B) and 4(C). Since it is only necessary that the orientation of polarization of polarizing films for fine slits 21, 23 and 25 of reticle 304 is orthogonal to the orientation of polarization of polarizing films for fine slits 22 and 24, combinations other than those shown in FIGS. 4(B) and 4(C) may be adopted provided that the above-described condition is satisfied.

Since the portion of the grating-like pattern of reticle 304 has the structure shown in FIG. 2(F), diffracted light beams from adjacent fine slits of the grating-like pattern of reticle 304 are incoherent, as described above. Hence, an image of the grating-like pattern having a high contrast is formed on wafer 308.

Figure 5:
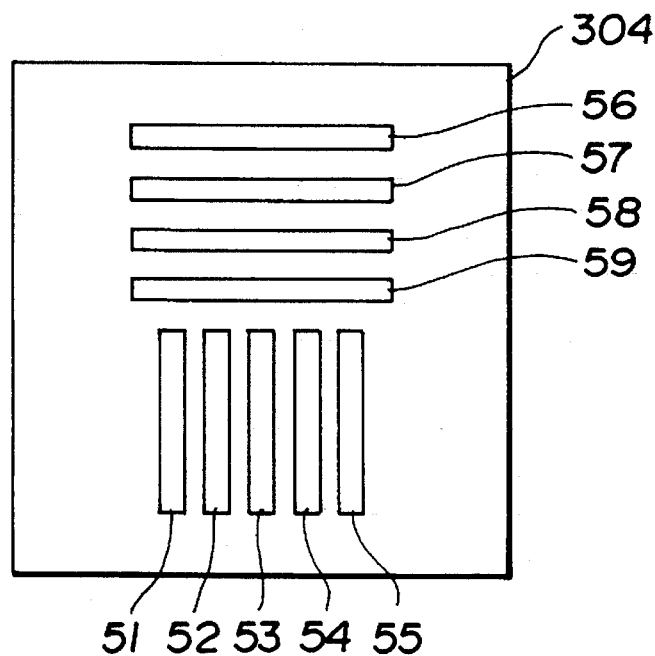
FIG. 5 is a plan view illustrating a reticle having a vertical-slit string and a horizontal-slit string.
Figure 6:
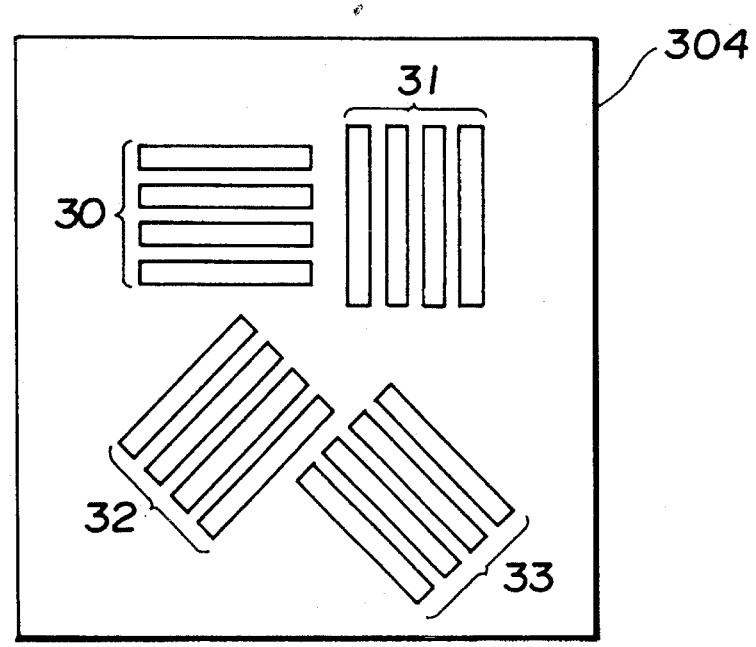
FIG. 6 is a plan view illustrating a reticle having a vertical-slit string, a horizontal-slit string and oblique-slit strings.
Figure 7:
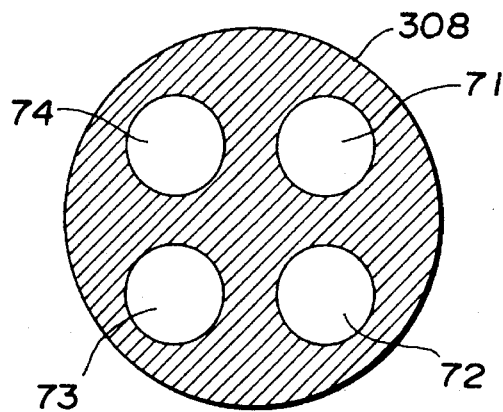
FIG. 7 is a diagram illustrating an example of apertures of an aperture stop of an illuminating system of an exposure apparatus.

FIG. 5 illustrates a state in which two kinds of strings of fine slits (51–55, and 58–59), whose longitudinal directions are orthogonal to each other, are provided on reticle 304. The technique used in the present embodiment can also be applied to such a reticle having a plurality of strings of fine slits whose longitudinal directions are different. Hence, the above-described technique has an advantage of improving resolution irrespective of the direction of fine slits on the reticle. Accordingly, the above-described technique can also be applied to the structure shown in FIG. 6, in which reticle 304 includes horizontal fine-slit string 30, vertical fine-slit string 31, and oblique fine-slit strings 32 and 33. When projecting an image of the pattern on reticle 304 shown in FIG. 6 using aperture stop 308 shown in FIG. 7, polarizing films may be provided for all of the fine-slit strings 30, 31, 32 and 33 of reticle 304, or polarizing films may be provided only for oblique fine-slit strings 32 and 33. In FIG. 7, blank portions 71–74 represent circular apertures, and the hatched portion represents a light-blocking portion. By using the aperture stop shown in FIG. 7, reticle 304 can be illuminated obliquely from four directions by four light beams from circular apertures 71–74.

In the apparatus shown in FIG. 3, an ultraviolet laser, such as a KrF excimer laser or the like, may be used as the light source for light-source unit 301.

Although the apparatus of FIG. 3 performs projection exposure using a projection lens system, the present invention may also be applied to an apparatus which performs projection exposure using a projection mirror system, and an apparatus which performs projection exposure using a projection mirror-and-lens system.

Figure 8:
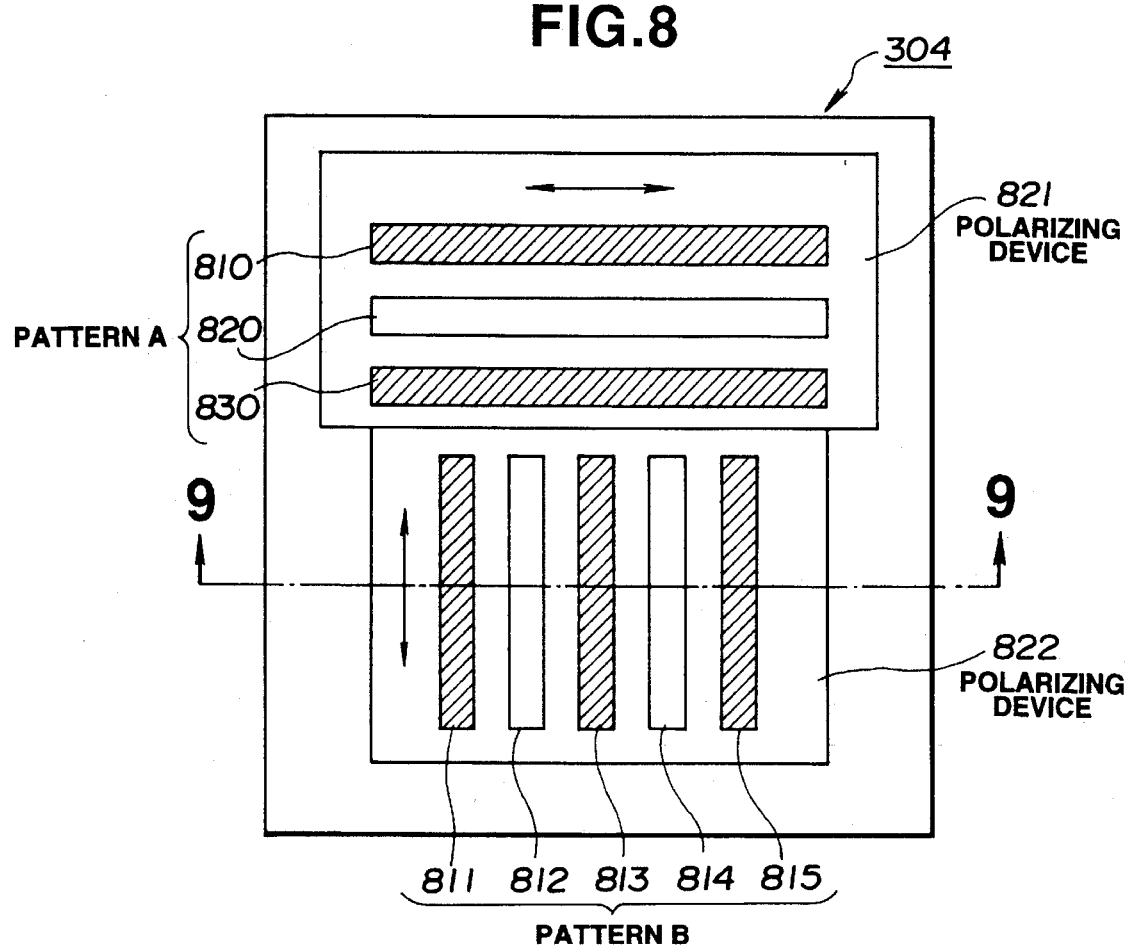
FIG. 8 is a diagram illustrating another example of a photomask of the present invention.

FIG. 8 is a diagram illustrating a photomask according to another embodiment of the present invention. The photomask of the present embodiment includes periodic pattern A comprising apertures 810–830 and periodic pattern B comprising apertures 811–815. A phase-shift method is applied to periodic patterns A and B, and phase shifters for changing the phase of transmitted light by 180 degrees are mounted on portions 810, 830, 811, 813 and 815 indicated by hatching in FIG. 80 In the present embodiment, polarizing device 821 for converting non-polarized light incident upon periodic pattern A into linearly-polarized light, and polarizing device 822 for converting non-polarized light incident upon periodic pattern B into linearly-polarized light are mounted. Polarizers or the like are used in polarizing devices 821 and 822. It is assumed that the orientations of polarization of light beams after passing through polarizing devices 821 and 822 equal the directions of respective arrows shown in FIG. 8. However, the orientations of polarization of the light beams are not necessarily the directions of the arrows, but any other directions may be chosen, provided that the two directions are orthogonal.

Figure 9:
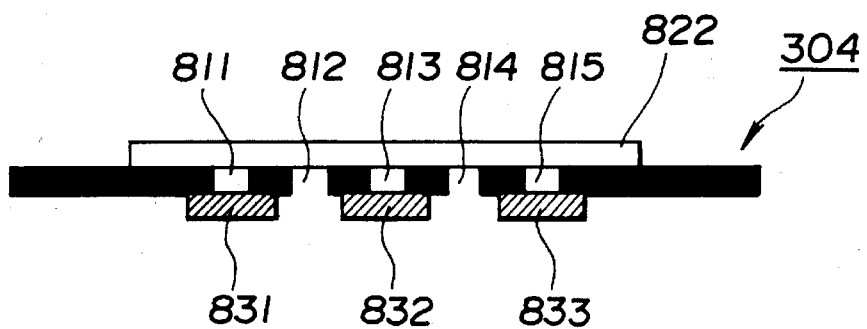
FIG. 9 is a cross-sectional view of the photomask shown in FIG. 8.

FIG. 9 is a cross-sectional view of the photomask shown in FIG. 8 taken along one-dot chain line 9. In FIG. 9, phase shifters 831, 832 and 833 are mounted on apertures 811, 813 and 815, respectively.

The effect obtained by mounting polarizing devices 821 and 822 will be now described. If exposure is performed without mounting polarizing devices 821 and 822, the pattern cannot be exactly transferred. The reason is that coherence between light passing through aperture 830 and light passing through apertures 811–815 is high.

Figure 10:
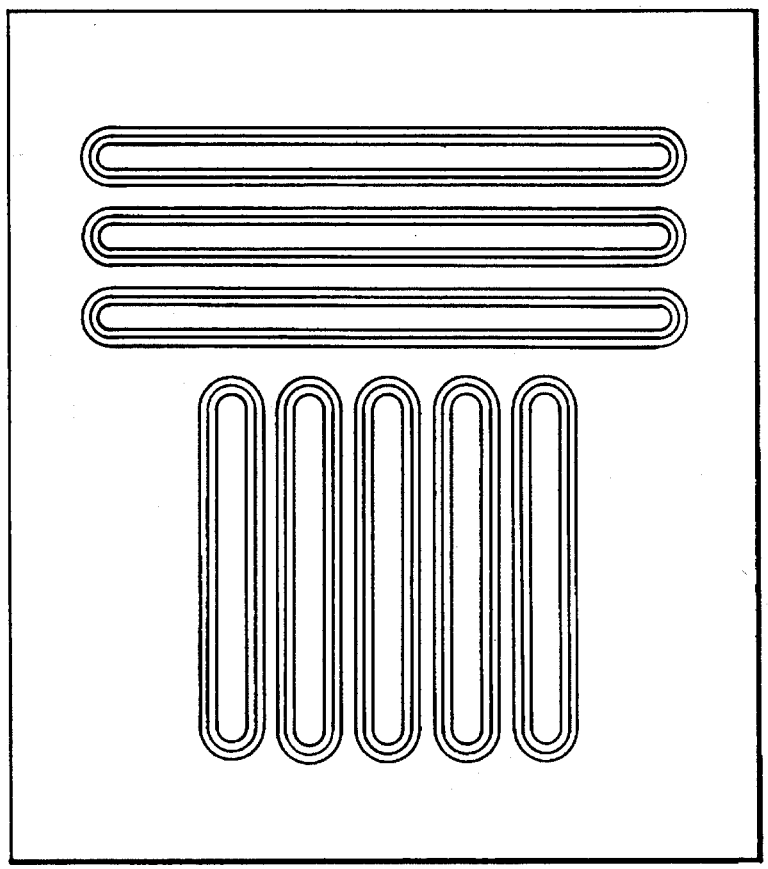
FIG. 10 is a diagram illustrating an intensity distribution of an image obtained by exposure through the photomask shown in FIG. 8.

In the present embodiment, however, by causing light beams transmitted through periodic patterns A and B to be linearly-polarized light beams polarized in the directions of the corresponding arrows, the light beams transmitted through periodic patterns A and B do not interfere with each other. Accordingly, the pattern (image) is not deformed on the image surface at the border between periodic patterns A and B due to interference of light, and a light intensity distribution that substantially faithfully reproduces the pattern of the photomask on the image plane is obtained, as shown in FIG. 10.

Although a description has not particularly been provided of exposure methods/apparatuses using the photomask shown in FIG. 8, the photomask shown in FIG. 8 may be used in any of the conventional exposure methods, such as reduction, unit magnification or magnified projection exposure, contact exposure and the like.

Although in the present embodiment, a description has been provided of a case in which two periodic patterns that are close to each other are present as patterns on the photomask, the present invention may also be applied to any other shapes and arrangements of patterns. This holds not only when the phase-shift method is applied to the patterns on the photomask, as in the present embodiment, but also when polarizing devices 821 and 822 are used for ordinary patterns to which the phase-shift method is not applied.

Although in the present embodiment a description has been provided assuming polarizers as the polarizing devices, any other devices having the capability of converting incident light into substantially linearly-polarized light, such as particular diffraction gratings or the like, may also be used as the polarizing devices.

It has been known that a method of shifting the phases of light beams passing through adjacent patterns by about 90 degrees with each other is effective in reducing deformation of the image due to interference of light. In the following embodiment, a description will be provided of a case in which the present invention is applied to a more complicated pattern by adopting such a method together with the above-described method.

Figure 11:
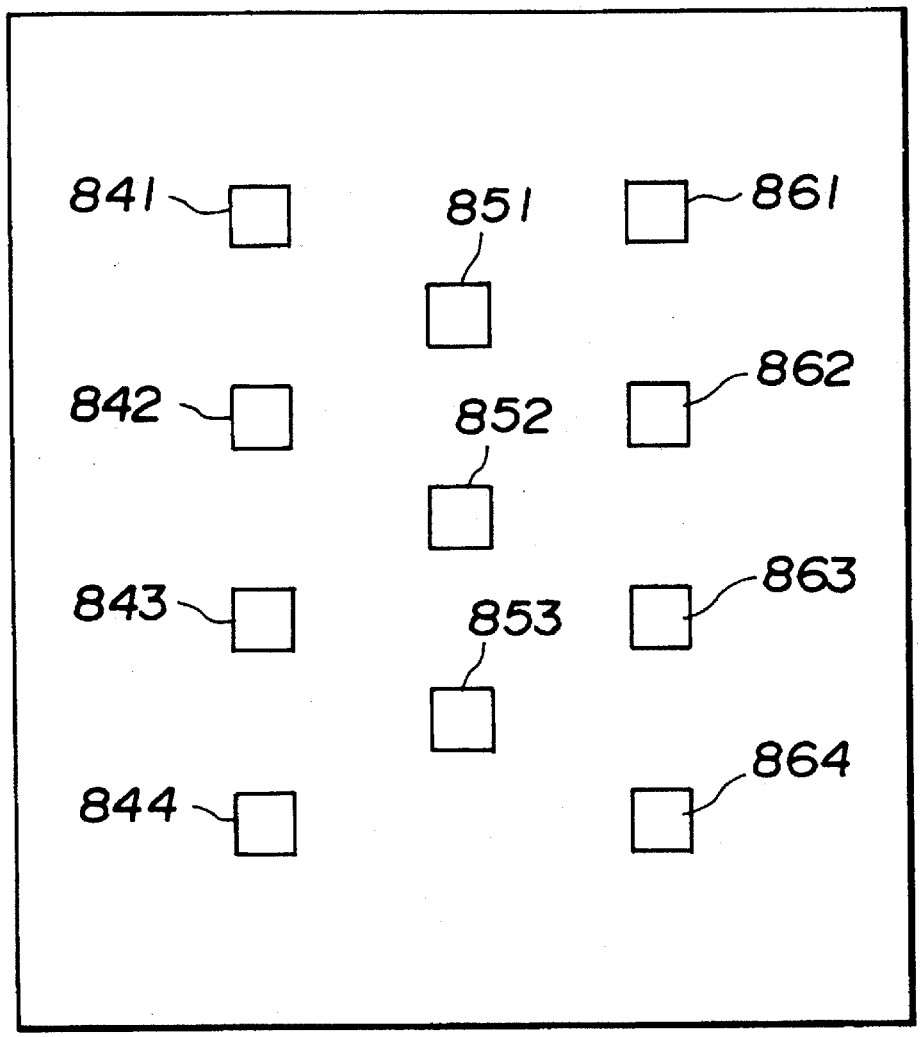
FIG. 11 is a diagram illustrating an example of a pattern configuration of a photomask.
Figure 12:
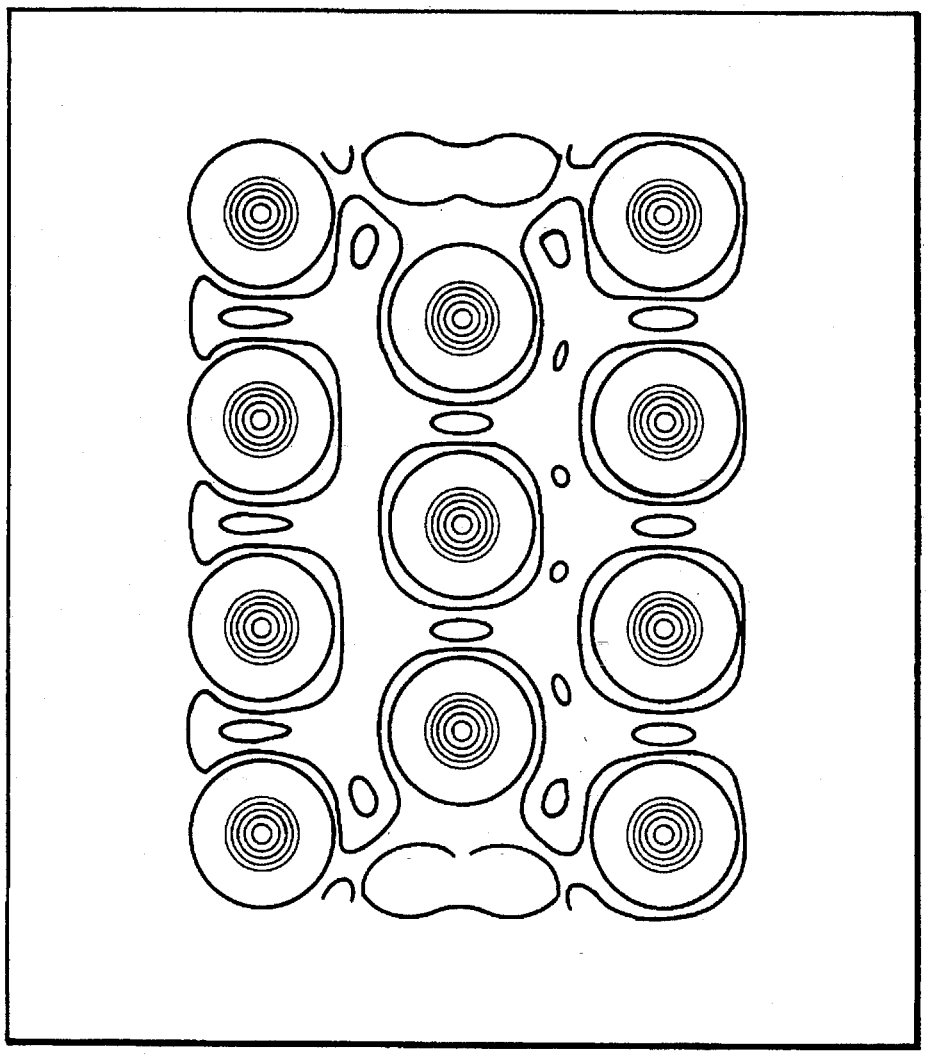
FIG. 12 is a diagram illustrating an intensity distribution of an image obtained by exposure through the photomask shown in FIG. 11.

In the present embodiment, the pattern shown in FIG. 11 will be considered as the pattern on the photomask. In FIG. 11, reference numerals 841–844, 851–853 and 861–864 represent apertures. FIG. 12 illustrates an intensity distribution of light obtained on the image plane when the photomask shown in FIG. 11 is illuminated with light having high coherence. In FIG. 12, the intensity distribution of light is illustrated in contour lines as in the case of FIG. 10. It becomes clear from FIG. 12 that the light intensity does not become zero due to interference of light even at portions where the light intensity must be zero, thereby causing deterioration in the contrast of the image. A description will now be provided of the configuration of a photomask in which light beams transmitted through adjacent portions of apertures 841–844, 851–853 and 861–864 do not interfere with each other for the pattern of the photomask shown in FIG. 11.

Referring to four apertures 841–844, if it is arranged so that the phases of light beams transmitted through these apertures alternately differ by 90 degrees, light beams transmitted through adjacent portions of apertures 841–844 do not interfere with each other. The same approach can be adopted for apertures 851–853 and 861–864. In order that light beams transmitted through adjacent portions between apertures 841–844 and 851–853, or apertures 851–853 and 861–864 do not interfere with each other, the present invention may be applied so that the orientations of polarization of light beams transmitted through adjacent portions between each combination of apertures 841–844, apertures 851–853 and apertures 861–864 are orthogonal to each other.

Figure 13:
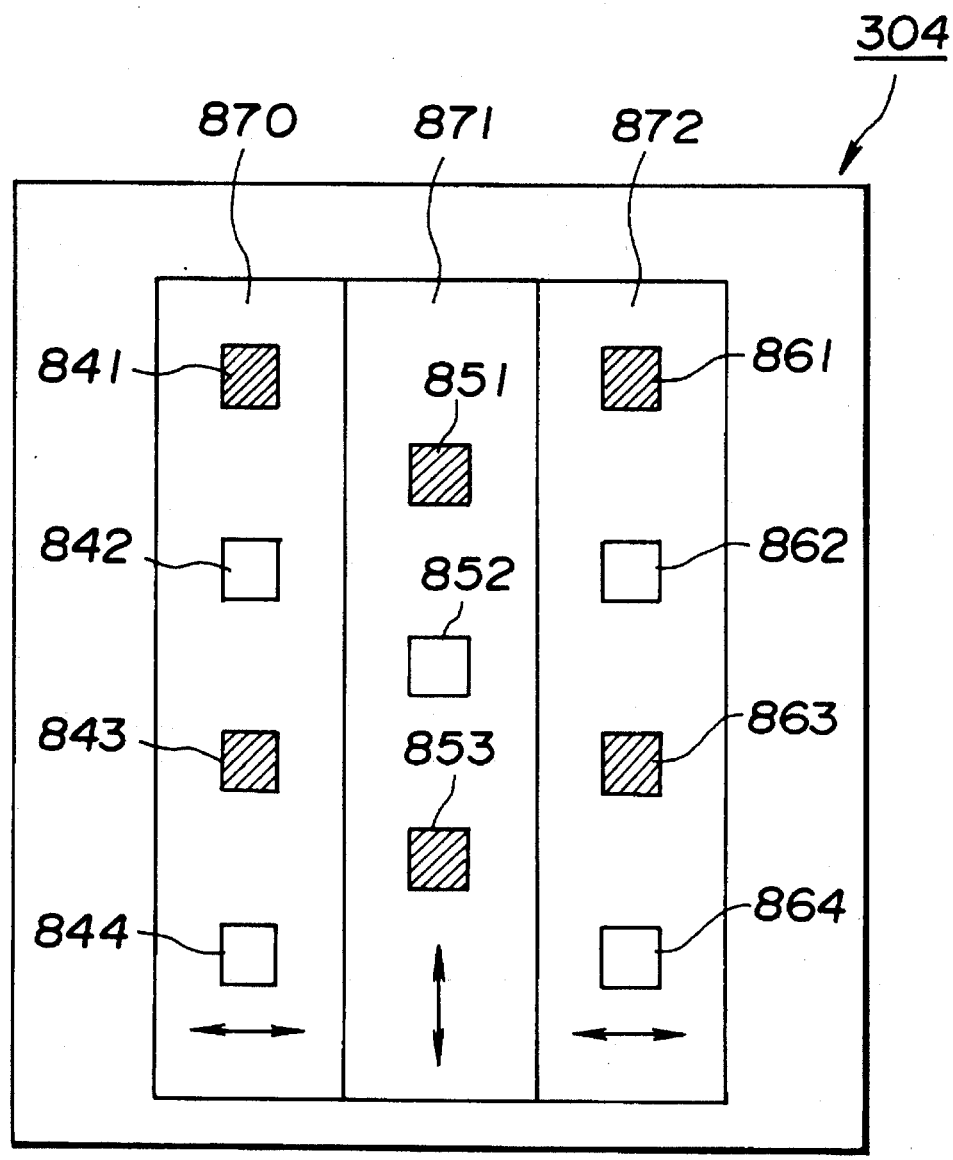
FIG. 13 is a diagram illustrating another embodiment of the present invention in which the invention is applied to the photomask shown in FIG. 11.

FIG. 13 illustrates an example of the configuration of a photomask which satisfies all of the above-described conditions. In FIG. 13, a phase member for changing the phase of transmitted light by 90 degrees is mounted on each of apertures 841, 843, 851, 853, 861 and 863, as indicated by hatching. Reference numerals 870, 871 and 872 represent polarizing devices, such as polarizers or the like, each of which converts incident light into linearly-polarized light having the plane of polarization in the direction indicated by the corresponding arrow.

Figure 14:
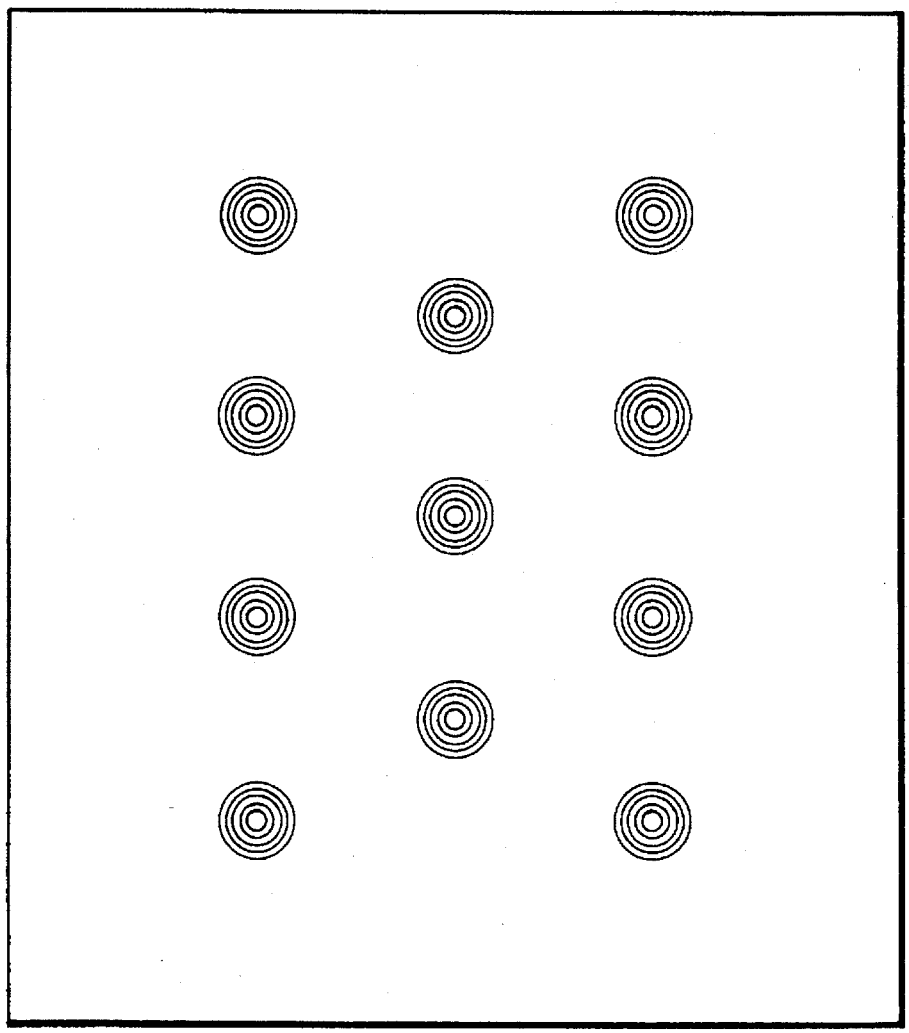
FIG. 14 is a diagram illustrating an intensity disribution of an image obtained by exposure through the photomask shown in FIG. 13.

FIG. 14 illustrates a light intensity distribution on the image surface formed using the photomask shown in FIG. 13. In this case, the influence of interference between light beams transmitted through adjacent apertures is suppressed, and images of pattern apertures 841–844, 851 853 and 861–864 are substantially faithfully reproduced.

Although the exposure method using the photomask of the present embodiment has not particularly been described, the present invention may be applied to any of the conventional exposure methods, such as reduction, unit magnification and magnified projection exposure, contact exposure and the like.

Although in the present embodiment, a description has been provided assuming polarizers as the polarizing devices, any other devices having the capability of converting incident light into substantially linearly-polarized light, such as particular diffraction gratings or the like, may also be used as the polarizing devices.

In the above-described embodiment, polarizers are used in order to cause the orientations of polarization of light beams from adjacent apertures to be orthogonal to each other. However, the object of the present invention will also be achieved, for example, by using linearly-polarized light, such as laser light or the like, as light for illuminating a photomask or a reticle, and by providing a member having optical activity to rotate the orientation of polarization of the linearly-polarized light by 90 degrees, for example, an electrooptical crystal, such as quartz or the like, or a $\lambda/2$ plate formed using a film, at one of adjacent apertures, or by causing the orientations of polarization of light for illuminating one of adjacent apertures and light for illuminating another aperture to be orthogonal to each other (for example, by disposing the above-described polarizer or $\lambda/2$ plate at a position conjugate to the photomask pattern of the illuminating system).

Figure 15A:
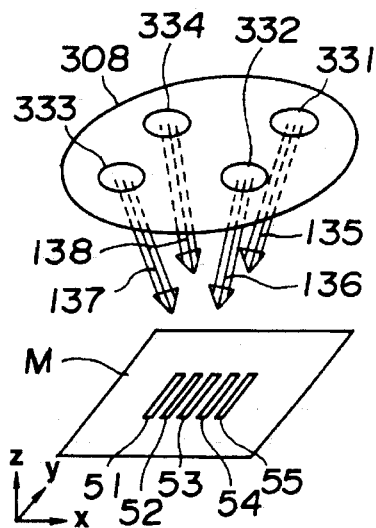
FIGS. 15(A) through 15(I) are diagrams illustrating image formation of a fine pattern by oblique illumination.
Figure 15B:
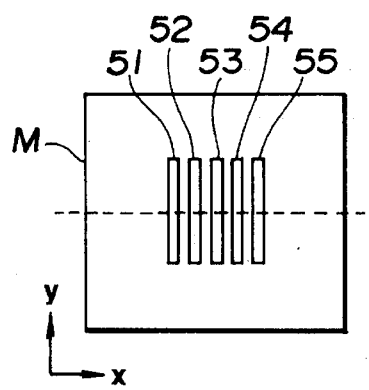
Figure 15C:
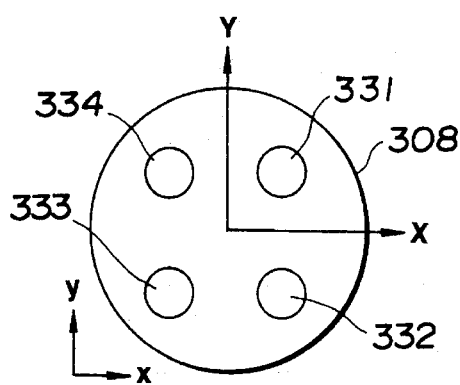

Next, a description will be provided of an improvement of resolution by oblique illumination. FIG. 15(A) is a diagram stereoscopically illustrating the positional relationship between mask M and four light beams 135–138 for obliquely illuminating mask M. In FIG. 15(A), reference numeral 308 represents an aperture stop of the illuminating system for supplying light beams 135–138, and reference numerals 331–334 represent apertures of aperture stop 308. FIG. 15(B) is a plan view of mask M, and FIG. 15(C) is a plan view of aperture stop 308.

Fine slits 51–55 have their longitudinal direction in the y direction, and are aligned in the x direction. Aperture stop 308 is arranged parallel to the xy plane. When the XY coordinates are set so that the X and Y axes are provided in the x and y directions, respectively, making the optical axis of the illuminating system (the optical axis of the projection lens system) the origin, the center of each of apertures 331–334 is positioned on the corresponding coordinates situated in the direction of 45 degrees from the origin. Accordingly, each of the planes of incidence formed by light beams 135–138 is a plane making an azimuth of 45 degrees with each of the zx plane and the zy plane, and the plane of incidence of light beams 136 and 138 and the plane of incidence of light beams 135 and 137 are orthogonal to each other. The plane of incidence is a plane including a line perpendicular to the plane of mask M and the central light of an obliquely incident light beam.

Figure 15D:
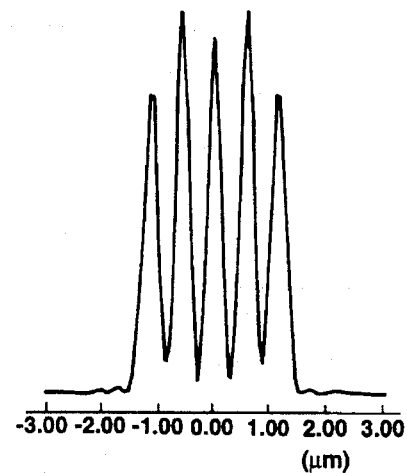
Figure 15E:
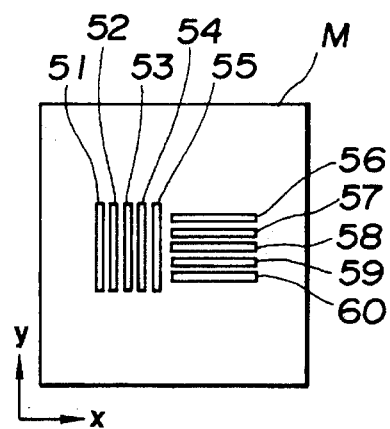

When mask M is obliquely illuminated by light beams 135–138, four light beams 135–138 are obliquely incident upon the grating pattern of mask M. Image formation of the string of fine slits 51–55 at that time will now be considered. In the same manner as in the above-described simulation, the intensity distribution of the image of the string of fine slits 51–55 at the image plane of the projection lens system will be simulated assuming that (i) the projection lens system includes an aberration free lens having a numerical aperture of 0.55, (ii) illumination comprises coherent illumination, and (iii) illuminating light comprises the i-line. The intensity distribution of the image of the string of fine slits 51–55 at the image plane of the projection lens system when the line width of fine slits 51–55 equals 0.3 μm, and the period of the string of fine slits 51–55 equals 0.6 μm is as shown in FIG. 15(D), in which a high contrast is obtained. Such an image having high contrast is also obtained for mask M with the grating pattern having the string of vertical fine slits 51–55 and the string of horizontal fine slits 56–60 shown in FIG. 15(E).

Figure 15F:
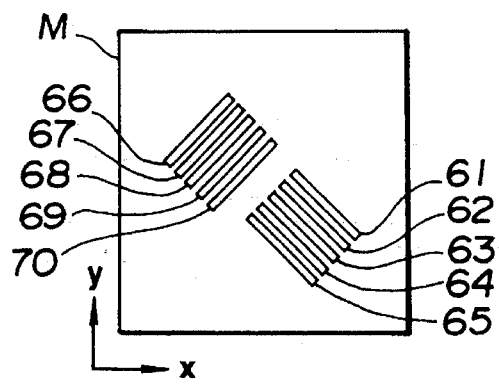
Figure 15G:
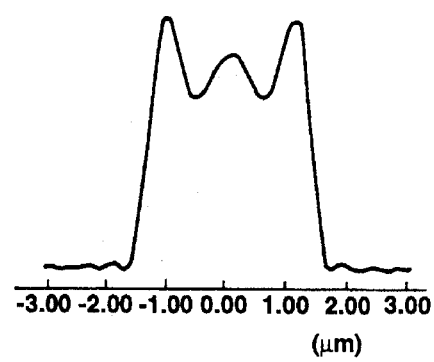
Figure 15H:
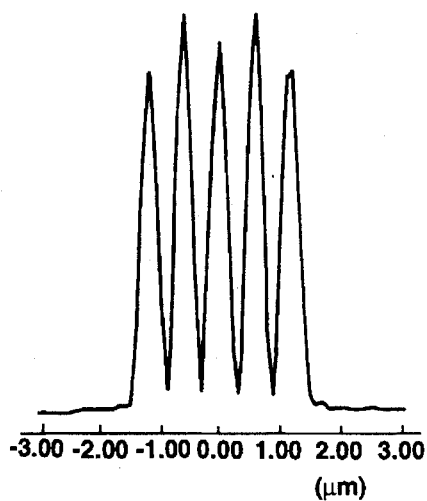
Figure 15I:
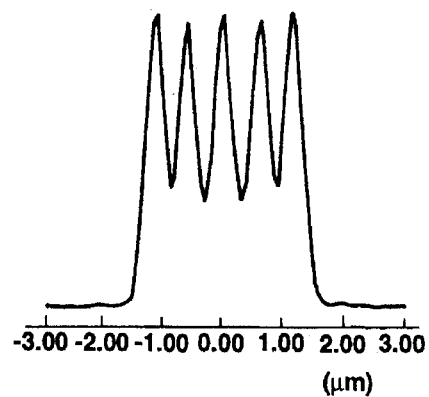

The intensity distributions of images obtained by obliquely illuminating mask M with the grating pattern shown in FIG. 15(F) having the string of oblique fine slits 61–65, which descend toward the right, and the string of oblique fine slits 66–70, which ascend toward the right and have a direction of grating lines orthogonal to that of the string of fine slits 61–65, with two light beams 135 and 137 and two light beams 136 and 138 from among four light beams 135–138, will be simulated in the same manner as described above. The longitudinal direction of fine slits which descend toward the right (the direction of grid lines) is parallel to the plane of incidence of each of light beams 136 and 138, and the longitudinal direction of fine slits which ascend toward the right (the direction of grid lines) is parallel to the plane of incidence of each of light beams 135 and 137. The intensity distribution of the image of the fine-slit string obtained when the grating pattern comprising the string of fine slits 61–65 is imaged only by illumination of light beams 135 and 137, or when the grid pattern comprising the string of fine slits 66–70 is imaged only by illumination of light beams 136 and 138 has a high contrast as shown in FIG. 15(H). On the other hand, the intensity distribution of the image of the fine-slit string obtained when the grating pattern comprising the string of fine slits 61–65 is imaged only by illumination of light beams 136 and 138, or when the grating pattern comprising the string of fine slits 66–70 is imaged only by illumination of light beams 135 and 137 has a low contrast as shown in FIG. 15(G). Accordingly, the intensity distribution of the image obtained when the string of fine slits 61–65 and the string of fine slits 66–70 are obliquely illuminated by four light beams 135–138 does not have high contrast, as shown in FIG. 15(I).

Figure 16A:
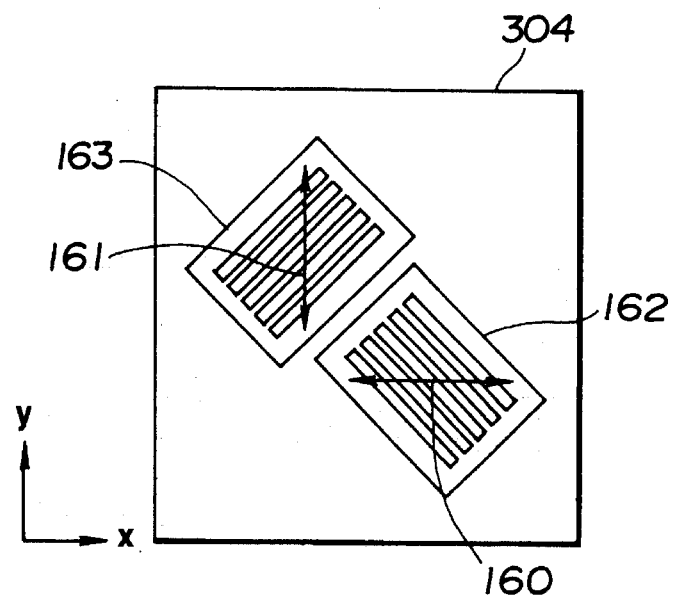
FIGS. 16(A) and 16(B) are diagrams illustrating another embodiment of the present invention.
Figure 16B:
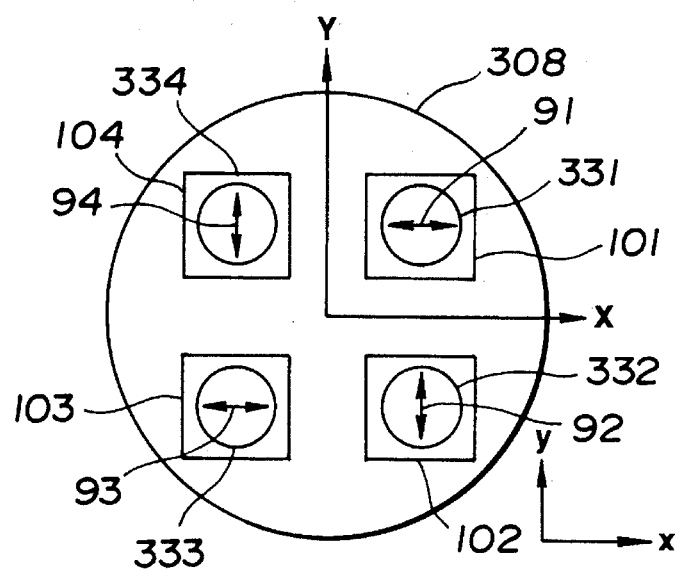

A description will now be provided of another embodiment of the present invention with reference to FIGS. 16(A) and 16(B). This embodiment also uses the reduction projection exposure apparatus shown in FIG. 3.

The operation of the apparatus shown in FIG. 3 will be repeated again. Exposure light emitted from light-source unit 301 illuminates reticle 304 via integrator 302, aperture stop 308 and illuminating lens system 303. Diffracted light from the circuit pattern on reticle 304 is incident upon the pupil of projection lens system 308, and an image of the circuit pattern is projected onto wafer 308 mounted on stage 307 by the diffracted light passing through projection lens system 305. The position of aperture stop 308 disposed close to the outgoing-light surface of integrator 302 and the pupil of projection lens system 305 are optically conjugate. Only a portion of the circuit pattern of reticle 304 that is suitable for image formation is selected from the light from integrator 302 by the apeture of aperture stop 308, and is transmitted to illuminating lens system 303 to be used for projection exposure.

A resist is coated on wafer 306. The resist on wafer 306 is sensitized by the circuit-pattern image. Thus, the circuit pattern is transferred onto wafer 306.

Reticle 304 and wafer 306 are aligned to a predetermined relationship by moving stage 307 on which wafer 306 is mounted. After exposure on the first region of wafer 306 has been completed, wafer 306 is moved in the horizontal direction by a predetermined amount by moving stage 307, and exposure on the second region of wafer 306 is performed.

The portion of the grating-like pattern of reticle 304 includes the string of oblique fine slits which descend toward the right and the string of oblique fine slits which ascend toward the right having the directions of grating lines orthogonal to each other, each having a line width of a few μm, as shown in FIG. 15(F). As shown in FIG. 16(A), polarizing film 162 whose orientation of polarization is set in the direction of arrow 160 is provided for the string (grid pattern) of fine slits which descend toward the right, and polarization film 163 whose orientation of polarization is set in the direction of arrow 161 is provided for the string (grid pattern) of fine slits which ascend toward the right. In the present embodiment, polarizing films (polarizing filters) 162 and 163 are formed on the upper surface of reticle 304. However, it is also possible to form polarizing films 162 and 163 on the lower surface of reticle 304. Aperture stop 308 includes four apertures 331–334 shown in FIGS. 15(A) and 15(C), and polarizing films (polarizing filters) 101–104, whose orientations of polarization are set in the directions of arrows 91–94 shown in FIG. 16(B), are provided on apertures 331–334, respectively. Polarization orientation directions 91 and 93 of respective polarizing films 101 and 103 coincide, and polarization orientation directions 92 and 94 of respective polarizing films 102 and 104 coincide. Polarization orientation directions 91 and 93 of respective polarizing films 101 and 103 and polarization orientation directions 92 and 94 of respective polarizing films 102 and 104 are orthogonal to each other. The plane of incidence formed by respective light beams from apertures 331 and 333 and the plane of incidence formed by respective linearly-polarized light beams from apertures 332 and 334 are orthogonal to each other. The plane of incidence formed by respective linearly-polarized light beams from apertures 331 and 333 is parallel to the direction of grating lines of the string of fine slits which ascend toward the right, and is orthogonal to the direction of grating lines of the string of fine slits which descend toward the right. The plane of incidence formed by respective linearly-polarized light beams from apertures 332 and 334 is parallel to the direction of grating lines of the string of fine slits which descend toward the right, and is orthogonal to the direction of grating lines of the string of fine slits which ascend toward the right.

The orientation of polarization of a polarizing film corresponds to the orientation of polarization of light which can pass through the polarizing film. Hence, polarized light whose orientation of polarization is orthogonal to the orientation of polarization of a polarizing film is absorbed by the polarizing film. In the present embodiment, polarization orientation direction 160 of polarizing film 162 provided above the string of fine slits, which descend toward the right, of reticle 304, and polarization orientation directions 92 and 94 of polarizing films 102 and 104 provided on apertures 332 and 334 of aperture stop 308, respectively, are orthogonal to each other. Polarization orientation direction 161 of polarizing film 163 provided above the string of fine slits, which ascend toward the right, of reticle 304, and polarization orientation directions 91 and 93 of polarizing films 101 and 103 provided on apertures 331 and 333 of aperture stop 308, respectively, are orthogonal to each other. Thus, the string of fine slits, which descend toward the right, of reticle 304 is not illuminated by two light beams from apertures 332 and 334 of aperture stop 308, but is illuminated by two light beams from apertures 331 and 333 of aperture stop 308. The string of fine slits, which ascend toward the right, of reticle 304 is not illuminated by two light beams from apertures 331 and 333 of aperture stop 308, but is illuminated by two light beams from apertures 332 and 334 of aperture stop 308. By performing such illumination, it is possible to avoid the use of light beams which reduce the contrast of respective images of the string of fine slits which descend toward the right and the string of fine slits which ascend toward the right for image formation of the respective strings of fine slits. Accordingly, it is possible to project and transfer the respective images of the string of fine slits which descend toward the right and the string of fine slits which ascend toward the right of reticle 304 onto wafer 306 with high resolution.

In the present embodiment, an ultraviolet laser, such as a KrF excimer laser or the like, may be used as the light source for light-source unit 301.

Although the present embodiment relates to an apparatus which performs projection exposure using a projection lens system, the present invention may also be applied to an apparatus which performs projection exposure using a projection mirror system, and an apparatus which performs projection exposure using a projection mirror-and-lens system.

FIG. 17 is a plan view illustrating another configuration of reticle 304. Reticle 304 includes grating pattern 80 configured by horizontal lines, grating pattern 81 configured by vertical lines, grating pattern 82 configured by oblique lines which descend toward the right, and grating pattern 83 configured by oblique lines which ascend toward the right, formed on the lower surface of a glass substrate. Polarizing films 86 and 87 are formed at portions corresponding to grating patterns 82 and 83 on the upper surface of the glass substrate. Orientations of polarization of polarizing films 86 and 87 are indicated by arrows 84 and 85, and are the same as polarization orientation directions 160 and 161 of polarization films 162 and 163 shown in FIG. 16(A), respectively. Using this arrangement, it is also possible to image the respective grating patterns of reticle 304 shown in FIG. 17 with high contrast, as in the case of the grating patterns shown in FIG. 16(B).

Each combination of FIGS. 18(A) and 18(B), and FIGS. 19(A) and 19(B) represents schematic diagrams showing the orientations of polarization of polarizing films provided on reticle 304 and the orientations of polarization of polarizing films provided on apertures of aperture stop 308, respectively, according to still another embodiment of the present invention. In FIGS. 18(A), 18(B), 19(A) and 19(B), the orientations of polarization are indicated by the corresponding arrows.

Figure 20:
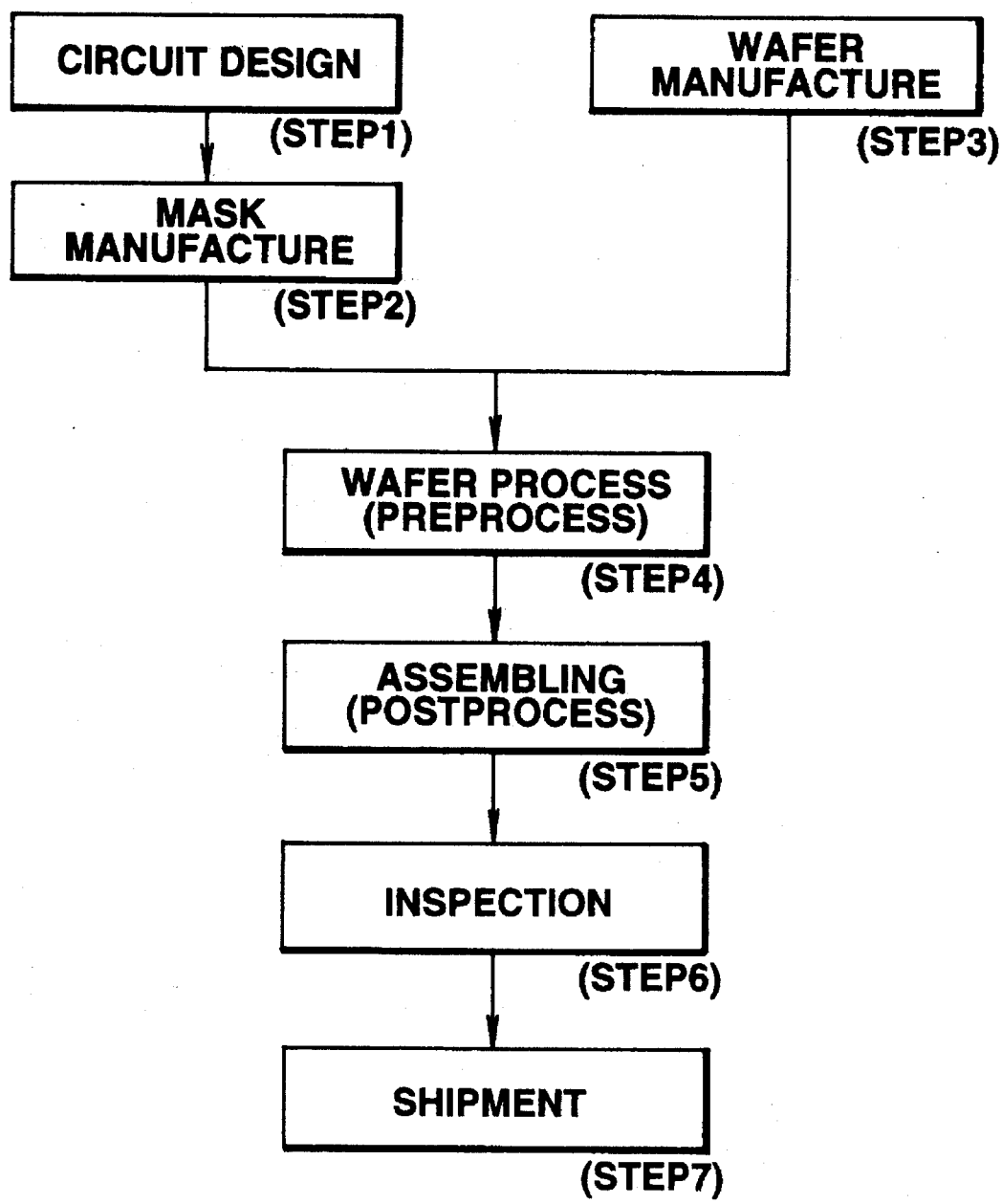
FIG. 20 is a flowchart illustrating a manufacturing process of semiconductor devices.

Next, a description will be provided of an embodiment relating to a device manufacturing method which utilizes the above-described image projection method. FIG. 20 illustrates a flow for manufacturing semiconductor devices (semiconductor chips of IC's (integrated circuits), LSI's (large-scale integrated circuits), or the like, liquid-crystal panels, CCD's (charge-coupled devices), or the like). In step 1 (circuit design), circuit design of semiconductor devices is performed. In step 2 (mask manufacture), masks (reticles 304) on which designed circuit patterns are formed are manufactured. In step 3 (wafer manufacture), wafers (wafers 306) are manufactured using a material, such as silicon or the like. Step 4 (wafer process) is called a preprocess, in which actual circuits are formed on the wafers by means of photolithography using the above-described masks and wafers. The next step 5 (assembling) is called a postprocess, which manufactures semiconductor chips using the wafers manufactured in step 4, and includes an assembling process (dicing and bonding), a packaging process (chip encapsulation), and the like. In step 6 (inspection), inspection operations, such as operation-confirming tests, durability tests and the like of the semiconductor devices manufactured in step 5, are performed. The manufacture of semiconductor devices is completed after passing through the above-described processes, and the manufactured devices are shipped (step 7).

Figure 21:
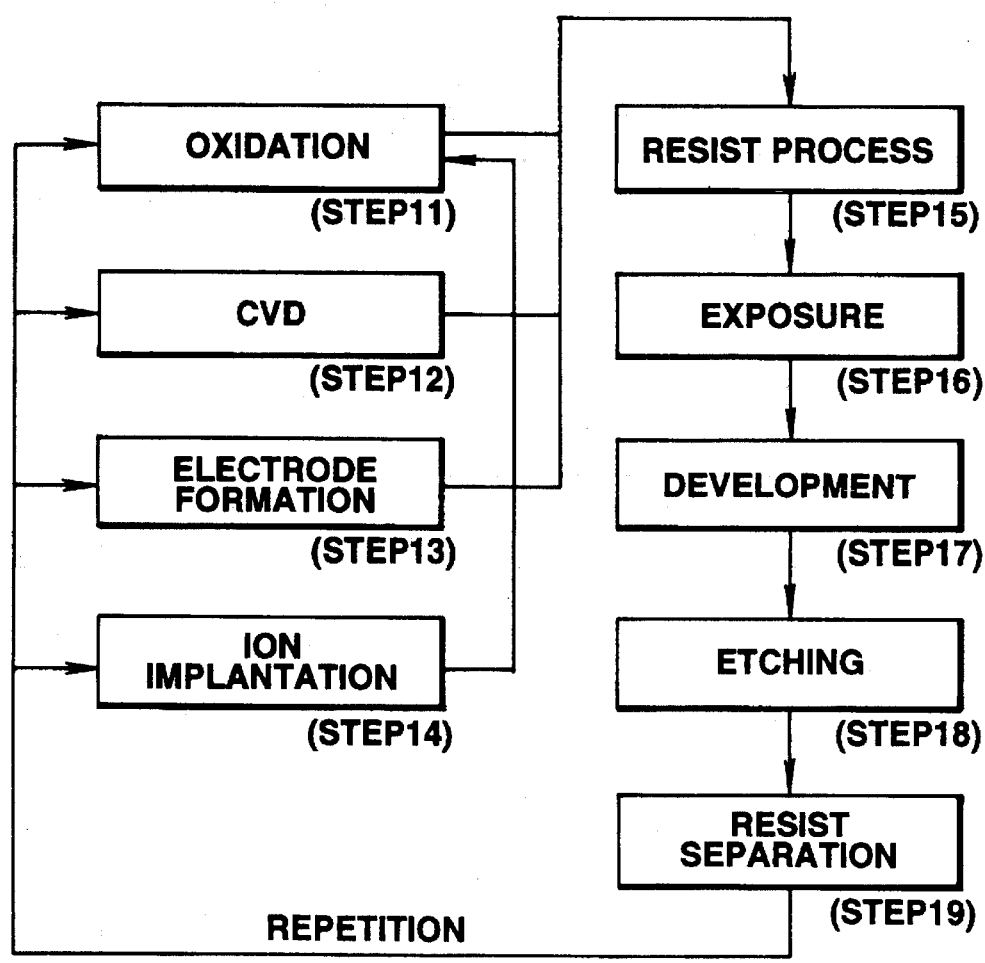
FIG. 21 is a flowchart illustrating the details of the wafer process in the process shown in FIG. 20.

FIG. 21 illustrates the detailed flow of the above-described wafer process. In step 11 (oxidation), the surface of the wafer (wafer 306) is oxidized. In step 12 (CVD), an insulating film is formed on the surface of the wafer. In step 13 (electrode formation), electrodes are formed on the surface of the wafer by vacuum deposition. In step 14 (ion implantation), ions are implanted into the wafer. In step 15 (resist process), a resist (a photosensitive material) is coated on the wafer. In step 16 (exposure), the circuit pattern on the mask (reticle 304) is exposed and printed on the wafer by the above-described projection exposure apparatus. In step 17 (development), the exposed wafer is developed. In step 18 (etching), portions other than the developed resist image are etched off. In step 19 (resist separation), the resist which becomes unnecessary after the completion of the etching is removed. By repeating these steps, a final circuit pattern is formed on the wafer.

The individual components shown in outline or designated by blocks in the drawings are all well-known in the image formation and device manufacturing arts, and their specific construction and operation are not critical to the operation or best mode for carrying out the invention.

While the present invention has been described with respect to what is presently considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method of forming an image of a fine pattern on an image-forming surface, comprising the steps of:

providing a reticle having a fine pattern of light-projecting portions separated by non-light-projecting portions formed thereon;

illuminating the reticle with non-polarized light to project light beams from the light-projecting portions of the fine pattern onto the image-forming surface, to form an image thereon; and reducing coherence between light beams respectively projected from adjacent light-projecting portions by causing planes of polarization of the respective light beams from the respective adjacent light-projecting portions to be orthogonal to each other.

2. A method according to claim 1, wherein the light-projecting portions and the light-non-projecting portions comprise light-transmitting portions and light-blocking portions, respectively.

3. A method according to claim 1, wherein the light-projecting portions and the light-non-projecting portions comprise light-reflecting portions and light-blocking portions, respectively.

4. A method of manufacturing a device by projecting a fine pattern onto a wafer, comprising the steps of:

providing a reticle having a fine pattern of light-projecting portions separated by non-light-projecting portions formed thereon;

providing a wafer as an image-forming surface;

projecting an image of the fine pattern onto the wafer, said projecting step comprising:
(i) illuminating the reticle with nonpolarized light to project light beams from the light-projecting portions of the fine pattern onto the wafer; and
(ii) reducing coherence between light beams respectively projected from adjacent light-projecting portions by causing planes of polarization of the light beams from the respective adjacent light-projecting portions to be orthogonal to each other; and post-processing the wafer to form the device.

5. A method according to claim 4, wherein the light-projecting portions and the light-non-projecting portions comprise light-transmitting portions and a light-blocking portions, respectively.

6. A method according to claim 4, wherein the light-projecting portions and the light-non-projecting portions comprise light-reflecting portions and light-blocking portions, respectively.

7. A photomask that projects radiation beams from light-projecting portions when said photomask is irradiated, said photomask comprising:

a reticle having a fine pattern of light-projecting portions separated by light-non-projecting portions formed thereon, the light-projecting portions and the light-non-projecting portions comprising light-reflecting portions and light-blocking portions, respectively; and coherency reducing means for reducing coherence between radiation beams that are projected from respective adjacent light-projecting portions, said coherency reducing means comprising polarizing means provided for at least one group of the light-projecting portions for orienting polarization of radiation beams from the one group in a direction orthogonal to a direction of polarization orientation of radiation beams from another group of light-projecting portions.

8. A photomask according to claim 7, wherein said polarizing means comprises first polarizing means provided for the one group of light-projecting portions and second polarizing means provided for the other group of light-projecting portions, the first and second polarizing means respectively orienting polarizations of light beams from the respective groups of light-projecting portions in orthogonal directions.

9. An image forming method for illuminating first and second grating patterns to form an image of the second grating pattern on an image-forming surface using a first light beam and to form an image of the first grating pattern on the image-forming surface using a second light beam, said method comprising the steps of:

providing a first grating pattern having grating lines and a second grating pattern having grating lines substantially orthogonal to the grating lines of the first grating pattern;

illuminating the first and second grating patterns with an obliquely incident first light beam to form a plane of incidence parallel to the grating lines of the first grating pattern;

illuminating the first and second grating patterns with an obliquely incident second light beam to form a plane of incidence parallel to the grating lines of the second grating pattern;

providing the first grating pattern with light selection means for blocking the first light beam and passing the second beam, to form an image of the first grating pattern on the image-forming surface using the second light beam; and providing the second grating pattern with light selection means for blocking the second light beam and passing the first light beam, to form an image of the second grating pattern on the image-forming surface using the first light beam.

10. An image forming method for illuminating first and second grating patterns to form an image of the second grating pattern using a first light beam and to form an image of the first grating pattern using a second light beam, said method comprising the steps of:

providing a first grating pattern having grating lines and a second grating pattern having grating lines substantially orthogonal to the grating lines of the first grating pattern;

linearly polarizing a first light beam in a first plane and;

illuminating the first and second grating patterns with the first light beam so that the first light beam is obliquely incident to form a plane of incidence parallel to the grating lines of the first grating pattern;

linearly polarizing a second light beam in a second plane orthogonal to the first plane;

illuminating the first and second grating patterns with the second light beam so that the second light beam is obliquely incident to form a plane of incidence parallel to the grating lines of the second grating pattern;

providing the first grating pattern with polarizing means for blocking the first light beam, to form an image of the first grating pattern using the second light beam; and providing the second grating pattern with polarizing means for blocking the second light beam, to form an image of the second grating pattern using the first light beam.

11. An image forming method for forming images of first, second and third grating patterns by illumination, said method comprising the steps of:

providing a first grating pattern having grating lines and a second grating pattern having grating lines substantially orthogonal to the grating lines of the first grating pattern;

providing a third grating pattern having grating lines in an oblique direction with respect to the grating lines of the first grating pattern and the second grating pattern;

linearly polarizing a first light beam in a first plane;

illuminating all of the grating patterns with the first light beam so that the first light beam is obliquely incident to form a plane of incidence parallel to the grating lines of the first grating pattern;

linearly polarizing a second light beam in a second plane orthogonal to the first plane;

illuminating all of the grating patterns with the second light beam so that the second light beam is obliquely incident to form a plane of incidence parallel to the grating lines of the second grating pattern;

providing the first grating pattern with polarizing means for blocking the first light beam, to form an image of the first grating pattern using the second light beam;

providing the second grating pattern with polarizing means for blocking the second light beam, to form an image of the second grating pattern using the first light beam; and forming an image of the third grating pattern using light from the first and second light beams.

12. A method of forming an image of a fine pattern on an image-forming surface, comprising the steps of:

providing a reticle having a fine pattern of light-projecting portions separated by non-light-projecting portions formed thereon, the light-projecting portions and the non-light-projecting portions comprising light-reflecting portions and light-blocking portions, respectively;

illuminating the reticle to project light beams from the light-projecting portions of the fine pattern onto the image-forming surface, to form an image thereon; and reducing coherence between light beams respectively projected from adjacent light-projecting portions by causing planes of polarization of the light beams from the respective adjacent light-projecting portions to be orthogonal to each other.

13. A device manufacturing method comprising the steps of:

providing a reticle having formed thereon a device circuit pattern including a first grating pattern having grating lines and a second grating pattern having grating lines substantially orthogonal to the grating lines of the first grating pattern;

providing a wafer to receive a projected image of the circuit pattern;

linearly polarizing a first light beam in a first plane;

illuminating the reticle with the first light beam so that the first light beam is obliquely incident to form a plane of incidence parallel to the grating lines of the first grating pattern;

linearly polarizing a second light beam in a second plane orthogonal to the first plane;

illuminating the reticle with the second light beam so that the second light beam is obliquely incident to form a plane of incidence parallel to the grating lines of the second grating pattern;

providing the first grating pattern with polarizing means for blocking the first light beam, to project an image of the first grating pattern of the circuit onto the wafer using the second light beam;

providing the second grating pattern with polarizing means for blocking the second light beam, to project an image of the second grating pattern of the circuit onto the wafer using the first light beam; and post-processing the wafer to form the device.

14. A device manufacturing method comprising the steps of:

providing a reticle having formed thereon a device circuit pattern including a first grating pattern having grating lines, a second grating pattern having grating lines substantially orthogonal to the grating lines of the first grating pattern and a third grating pattern having grating lines in an oblique direction with respect to the grating lines of the first grating pattern and the second grating pattern, providing a wafer to receive a projected image of the circuit pattern;

linearly polarizing a first light beam in a first plane;

illuminating the reticle with the first light beam so that the first light beam is obliquely incident to form a plane of incidence parallel to the grating lines of the first grating pattern;

linearly polarizing a second light beam in a second plane orthogonal to the first plane;

illuminating the reticle with the second light beam so that the second light beam is obliquely incident to form a plane of incidence parallel to the grating lines of the second grating pattern;

providing the first grating pattern with polarizing means for blocking the first light beam, to project an image of the first grating pattern onto the wafer using the second light beam;

providing the second grating pattern with polarizing means for blocking the second light beam, to project an image of the second grating pattern onto the wafer using the first light beam; and post-processing the wafer to form the device.

15. A device manufacturing method comprising the steps of:

providing a reticle having formed thereon a device circuit pattern including a first grating pattern having grating lines and a second grating pattern having grating lines substantially orthogonal to the grating lines of the first grating pattern;

providing a wafer to receive a projected image of the circuit pattern;

illuminating the reticle with a first light beam that is obliquely incident to form a plane of incidence parallel to the grating lines of the first grating pattern;

illuminating the reticle with a second light beam that is obliquely incident to form a plane of incidence parallel to the grating lines of the second grating pattern;

providing the first grating pattern with light selection means for blocking the first light beam and passing the second light beam, to project an image of the first grating pattern onto the wafer using the second light beam;

providing the second grating pattern with light selection means for blocking the second light beam and passing the first light beam, to project an image of the second grating pattern onto the wafer using the first light beam; and post-processing the wafer to form the device.

16. A method of manufacturing a device by projecting a fine pattern onto a wafer, comprising the steps of:

providing a reticle having a fine pattern of light-projecting portions separated by non-light-projecting portions formed thereon, the light-projecting portions and the non-light-projecting portions comprising light-reflecting portions and light-blocking portions, respectively;

providing a wafer as an image-forming surface;

projecting an image of the fine pattern onto the wafer, said projecting step comprising:
  (i) illuminating the reticle to project light beams from the light-projecting portions of the fine pattern onto the wafer; and
  (ii) reducing coherence between light beams respectively projected from adjacent light-projecting portions by causing planes of polarization of the light beams from the respective adjacent light-projecting portions to be orthogonal to each other.

* * * * *

UNITED STATES PATENT AND TRADEMARK OFFICE
CERTIFICATE OF CORRECTION

PATENT NO. : 5,459,000
DATED : October 17, 1995
INVENTOR(S) : YASUYUKI UNNO

It is certified that error appears in the above-indentified patent and that said Letters Patent is hereby corrected as shown below:

COLUMN 5:

Line 28, "IS(F)" should read --15(F)--.

COLUMN 8:

Line 3, "308." (first occurrence) should read --306.--.
Line 51, "308." should read --306.--.

COLUMN 9:

Line 25, "FIG. 80" should read --FIG. 8 --.

COLUMN 11:

Line 1, "851 853" should read --851-853--.

UNITED STATES PATENT AND TRADEMARK OFFICE
CERTIFICATE OF CORRECTION

PATENT NO. : 5,459,000
DATED : October 17, 1995
INVENTOR(S) : YASUYUKI UNNO

It is certified that error appears in the above-indentified patent and that said Letters Patent is hereby corrected as shown below:

COLUMN 12:

Line 53, "308," should read --305,--.
Line 62, "aperture of aperture" should read --aperture of--.

COLUMN 16:

Line 22, "a" should be deleted.

COLUMN 19:

Line 18, "beam,to" should read --beam, to--.

Signed and Sealed this

Twenty-sixth Day of March, 1996

Attest:

BRUCE LEHMAN

Attesting Officer    Commissioner of Patents and Trademarks